(12) United States Patent
Fujimoto et al.

(10) Patent No.: US 11,587,933 B2
(45) Date of Patent: Feb. 21, 2023

(54) SEMICONDUCTOR MEMORY DEVICE AND METHOD OF FORMING THE SAME

(71) Applicant: MICRON TECHNOLOGY, INC., Boise, ID (US)

(72) Inventors: Toshiyasu Fujimoto, Higashihiroshima (JP); Hiromitsu Oshima, Higashihiroshima (JP)

(73) Assignee: Micron Technology, Inc., Boise, ID (US)

( * ) Notice: Subject to any disclaimer, the term of this patent is extended or adjusted under 35 U.S.C. 154(b) by 77 days.

(21) Appl. No.: 17/221,664

(22) Filed: Apr. 2, 2021

(65) Prior Publication Data

US 2022/0320101 A1 Oct. 6, 2022

(51) Int. Cl.
*H01L 29/76* (2006.01)
*H01L 29/94* (2006.01)
*H01L 27/108* (2006.01)
*H01L 29/06* (2006.01)
*G11C 11/402* (2006.01)

(52) U.S. Cl.
CPC .... *H01L 27/10823* (2013.01); *G11C 11/4023* (2013.01); *H01L 29/0649* (2013.01)

(58) Field of Classification Search
CPC .......... H01L 27/10823; H01L 29/0649; G11C 11/4023
USPC ........................................................ 257/296
See application file for complete search history.

(56) References Cited

U.S. PATENT DOCUMENTS

| | | | |
|---|---|---|---|
| 2008/0079070 A1* | 4/2008 | Seo | ...................... H01L 29/7853 257/E21.429 |
| 2010/0240180 A1* | 9/2010 | Jeon | ........................ H01L 29/78 438/270 |

* cited by examiner

*Primary Examiner* — Theresa T Doan
(74) *Attorney, Agent, or Firm* — Dorsey & Whitney LLP (57) ABSTRACT

An apparatus includes: a semiconductor substrate; an isolation region in the semiconductor substrate, the isolation region including an isolation trench filled with an insulating material therein; a plurality of island-shaped active regions in the semiconductor substrate surrounded by the isolation region; and a buried word-line having a bottom, the buried word-line at least passing across the isolation region between the plurality of active regions; wherein the isolation trench includes upper, middle and lower portions, each of the upper and lower portions has a substantially flat surface and the middle portion has a bulged surface.

8 Claims, 13 Drawing Sheets

SEMICONDUCTOR MEMORY DEVICE AND METHOD OF FORMING THE SAME

BACKGROUND

In recent years, in a semiconductor memory device exemplified by a dynamic random-access memory (hereinafter referred to as DRAM), as a structure of a transistor for a memory cell, a trench gate structure or a buried word-line structure has been employed. In DRAM, the distance between memory cells becomes closer as the miniaturization is promoted, and due to the influence of an increase in the interaction of a word line and an adjacent memory cell, the fluctuation in refresh characteristics and row hammer characteristics may be caused. It is defined that a word line passing across an isolation region between adjacent active regions 10, that is, the word line of the isolation region between the adjacent active regions 10, as a passing-word-line. In the following sentences, "passing-word-line" is described as "pWL". When the distance between the pWL and an adjacent memory cell becomes closer, the influence of the electric field of the pWL to the adjacent memory cell increases, and this may cause fluctuation in the refresh characteristics and the row hammer characteristics.

BRIEF DESCRIPTION OF THE DRAWINGS

FIG. 4 is a longitudinal sectional view illustrating a schematic configuration of the memory cell array region at an exemplary process phase following FIG. 11A and FIG. 11B and is a longitudinal sectional view of a portion along the X-X line in FIG. 3.

FIG. 6 is a longitudinal sectional view illustrating a schematic configuration of the memory cell array region at an exemplary process phase and is a longitudinal sectional view illustrating a schematic configuration of a portion along the X-X line in FIG. 5.

FIG. 7 is a longitudinal sectional view illustrating a schematic configuration of the memory cell array region at an exemplary process phase following FIG. 6 and is a longitudinal sectional view illustrating a schematic configuration of the portion along the X-X line in FIG. 5.

FIG. 8 is a longitudinal sectional view illustrating a schematic configuration of the memory cell array region at an exemplary process phase following FIG. 7 and is a longitudinal sectional view illustrating a schematic configuration of the portion along the X-X line in FIG. 5.

FIG. 9A is a plan view illustrating a schematic configuration of the layout of the memory cell array region. FIG. 9B is a longitudinal sectional view illustrating a schematic configuration of the memory cell array region and is a longitudinal sectional view illustrating a schematic configuration of a portion along the X-X line in FIG. 9A.

FIG. 10A is a plan view illustrating a schematic configuration of the layout of the memory cell array region. FIG. 10B is a longitudinal sectional view illustrating a schematic configuration of the memory cell array region and is a longitudinal sectional view illustrating a schematic configuration of a portion along the X-X line in FIG. 10A.

FIG. 11A is a plan view illustrating a schematic configuration of the layout of the memory cell army region. FIG. 11B is a longitudinal sectional view illustrating a schematic configuration of the memory cell array region and is a longitudinal sectional view illustrating a schematic configuration of a portion along the X-X line in FIG. 11A.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

The following describes a semiconductor memory device 1 and a method of forming the same according to the embodiment with reference to FIG. 1 to FIG. 13. In the following description, a DRAM will be exemplified as a semiconductor memory device 1. The dimensions and the ratios of dimensions of each portion in each drawing do not necessarily coincide with the dimensions and the ratios of dimensions of the actual semiconductor device. Furthermore, in the following description, the vertical direction means the vertical direction when a semiconductor substrate 12 is a bottom.

Figure 1:
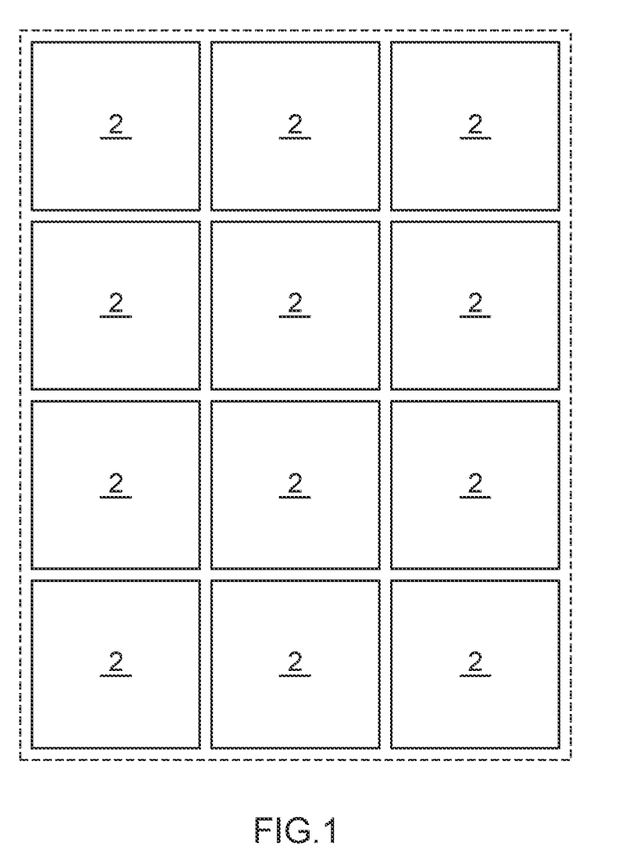
FIG. 1 is a plan view illustrating a schematic configuration of a portion of a memory cell array region of a semiconductor memory device according to an embodiment.
Figure 2:
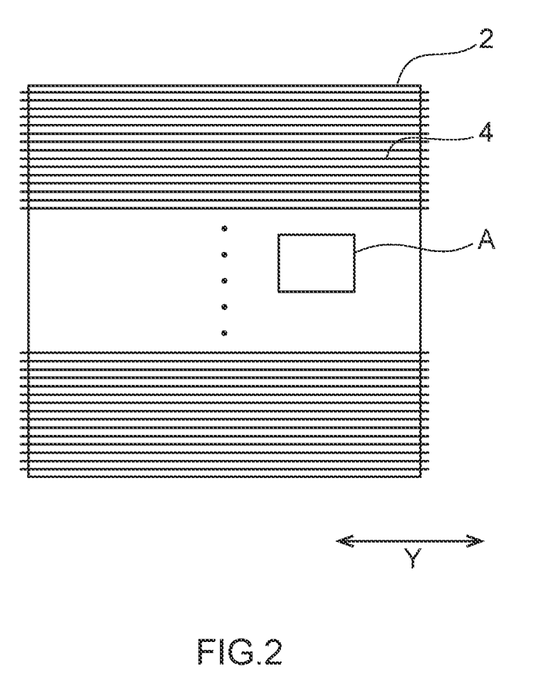
FIG. 2 is a plan view illustrating a schematic configuration of memory mats of the semiconductor memory device in the embodiment.

FIG. 1 and FIG. 2 are diagrams illustrating a portion of the planar layout of the semiconductor memory device 1 in the embodiment. As illustrated in FIG. 1, the semiconductor memory device 1 includes a plurality of memory mats 2. In each memory mat 2, as illustrated in FIG. 2, a plurality of word lines 4 are arranged in parallel, extending linearly in a predetermined direction. As the structure of the word lines 4, a trench gate structure or a buried word-line structure is employed. Each word line 4 is connected to a row decoder, which is not depicted at its end portion. The direction in parallel with the word line 4 is referred to as the word line direction Y.

Figure 3:
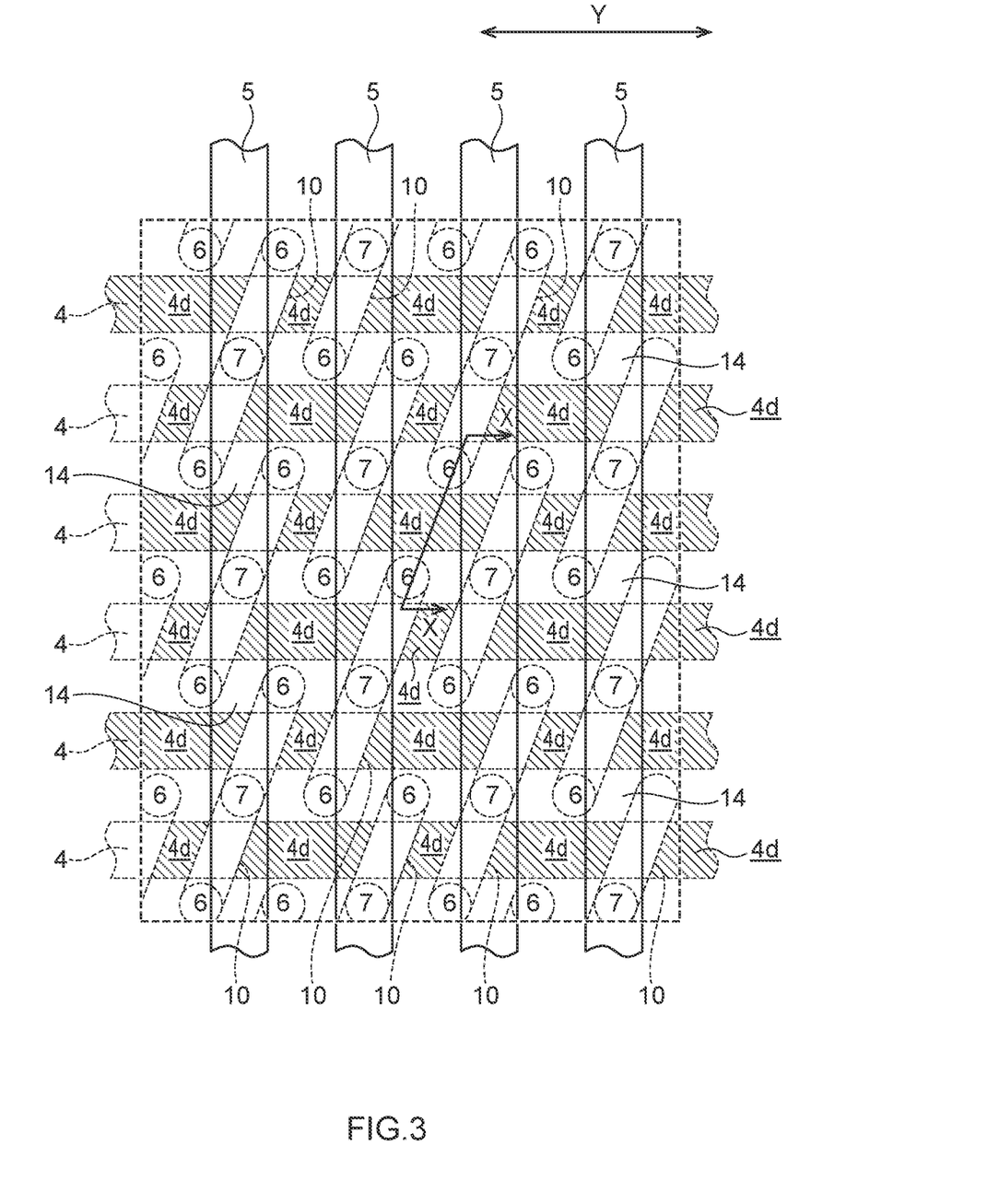
FIG. 3 is a planar layout diagram illustrating a schematic configuration of the memory cell array region of the semiconductor memory device in the embodiment.

FIG. 3 is a layout diagram in which the area A of the memory mat 2 illustrated in FIG. 2 is enlarged. As illustrated in FIG. 3, the area A is a memory cell array region in which a plurality of active regions 10 are arranged. In the memory cell array region, a plurality of word lines 4 arranged at an equal repetition pitch and a plurality of bit lines 5 arranged at an equal repetition pitch are arranged orthogonally. At the intersections of the word lines 4 and the bit lines 5, a plurality of island-shaped active regions 10 constituting memory cells are arranged. Each of the active regions 10 has an outer shape defined by isolation regions 14 that surround the active region 10 and electrically isolate between elements.

The active region 10 has an elongated substantially elliptical shape and its longitudinal direction is tilted at a predetermined angle with respect to the word line 4 or the bit line 5. The word line 4 functions as a gate electrode of an access transistor of the memory cell in the active region 10. The bit line 5 is connected to a middle portion of the active region 10 via a bit line contact 7. In the active region 10, on the opposite side to the bit line contact 7 with respect to the word line 4, a capacitor contact 6 is arranged. The capacitor contact 6 is connected to a capacitor 40 as will be described later with reference to FIG. 12.

The word line 4 linearly extends in the word line direction Y so as to cross a plurality of active regions 10 and isolation regions 14. The word line 4 in the isolation region 14 is the pWL 4d. The pWL 4d includes a portion of the word line 4.

Figure 4:
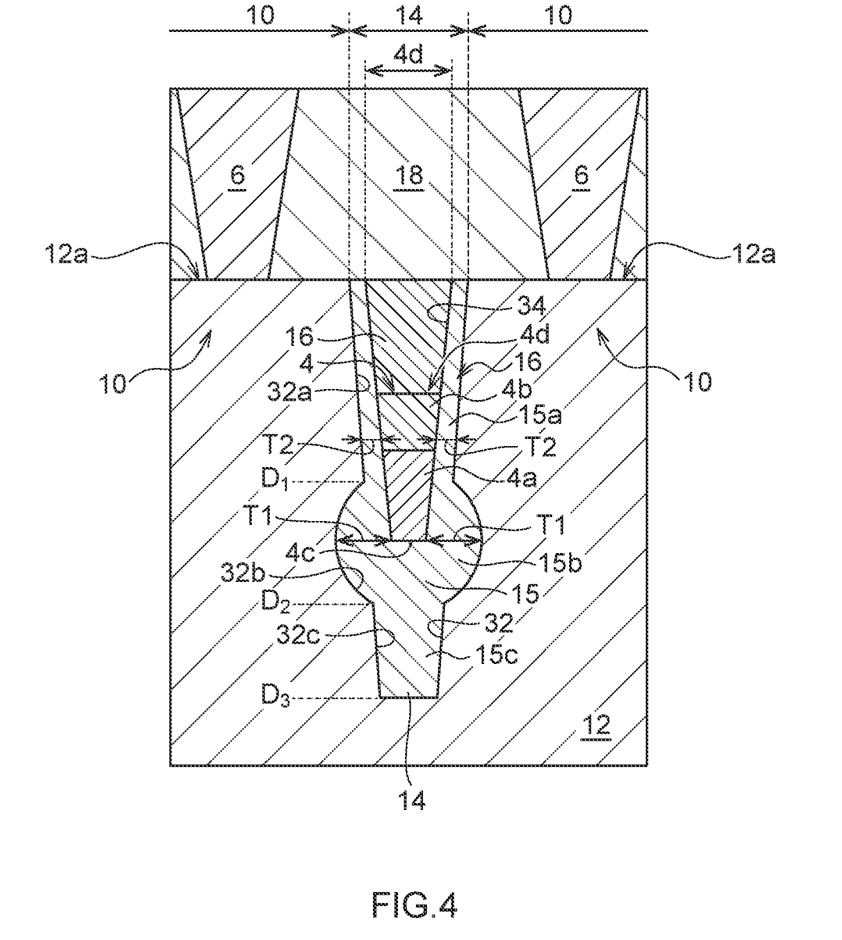
FIG. 4 is diagram illustrating the semiconductor memory device and a method of forming the same in the embodiment.

FIG. 4 is a longitudinal sectional view illustrating a schematic configuration of the semiconductor memory device 1 in the embodiment and is a longitudinal sectional view illustrating a schematic configuration of a portion along the X-X line in FIG. 3. In FIG. 4, the configuration above the capacitor contacts 6 is omitted. In FIG. 4, a schematic configuration of the active regions 10, the isolation region 14, and the pWL 4d arranged in the isolation region 14 is illustrated.

The isolation region 14 is formed by filling an isolation trench 32 provided in the semiconductor substrate 12 with an isolation insulating material 15. The semiconductor substrate 12 includes a single-crystal silicon substrate, for example. The isolation trench 32 includes a groove formed in the semiconductor substrate 12. In the following description, a first depth D1, a second depth D2, and a third depth D3 mean the dimension of depth from a top surface 12a of the semiconductor substrate 12.

The isolation trench 32 includes an upper trench 32a from the top surface 12a of the semiconductor substrate 12 to the first depth D1, a middle trench 32b from the first depth D1 to the second depth D2, and a lower trench 32c from the second depth D2 to the third depth D3. The inner surfaces of the upper trench 32a and the lower trench 32c are formed so as to be in a linear inverted taper shape in the cross-section. The inner surfaces of the upper trench 32a and the lower trench 32c have a substantially flat surface. The inner surfaces of the middle trench 32b sandwiched by the upper trench 32a and the lower trench 32c are bulged having a curvature so as to project toward the outside, that is, project to the active regions 10. The inner surfaces of the middle trench 32b are substantially circular in the cross-section. The inner surfaces of the middle trench 32b have bulged surfaces.

The isolation region 14 includes the isolation insulating material 15. The isolation insulating material 15 fills in the isolation trench 32. The isolation insulating material 15 includes an insulating material, such as silicon dioxide ($SiO_2$). The isolation insulating material 15 includes an upper insulating film 15a from the top surface 12a of the semiconductor substrate 12 to the first depth D1, a middle insulating film 15b from the first depth D1 to the second depth D2, and a lower insulating film 15c from the second depth D2 to the third depth D3.

In the isolation region 14, a word-line trench 34 is provided. The word-line trench 34 has a linear inverted taper shape in the cross-section. The word-line trench 34 is formed so as to linearly extend in the word line direction Y. In the word-line trench 34, a cap insulating material 16 and conductive materials 4a and 4b are filled. These conductive materials 4a and 4b act as the word line 4. The word-line trench 34 has an upper portion, a middle portion, and a lower portion. In the word-line trench 34, the cap insulating material 16 is arranged in the upper portion, an upper conductive portion 4b is arranged in the middle portion, and a lower conductive portion 4a is arranged in the lower portion. The lower conductive portion 4a includes a first conductive material, such as titanium nitride (TiN). The upper conductive portion 4b includes a second conductive material, such as polysilicon (Poly-Si). In polysilicon, impurities such as phosphorus (P), arsenic (As), or boron (B) are introduced. The cap insulating material 16 includes silicon nitride (SiN), for example.

A bottom 4c of the word line 4 is located near the middle of the first depth D1 and the second depth D2. The film thickness T1 of the isolation insulating material 15 at the bottom 4c of the word line 4 is thicker than the film thickness T2 of the upper insulating film 15a. In the region provided with the middle insulating film 15b, as in the foregoing, the inner surfaces of the middle trench 32b of the isolation trench 32 are bulged toward the outside and are substantially circular in the cross-section. The bottom 4c of the word line 4 is arranged within the range of depth of the middle trench 32b.

This increases the distances from the right and the left ends of the bottom 4c to the inner surfaces of the middle trench 32b. Thus, the film thickness of the isolation insulating material 15 filled in the isolation trench 32 is the thickest at the middle trench 32b. The film thickness T1 of the isolation insulating material 15 in the lateral direction of the bottom 4c is larger than the film thickness T2 of the isolation insulating material 15 in the lateral direction of the upper conductive portion 4b. The film thickness of the isolation insulating material 15 in the lateral direction of the word line 4 has the largest film thickness T1 of the isolation insulating material 15 in the lateral direction of the bottom 4c.

Figure 12:
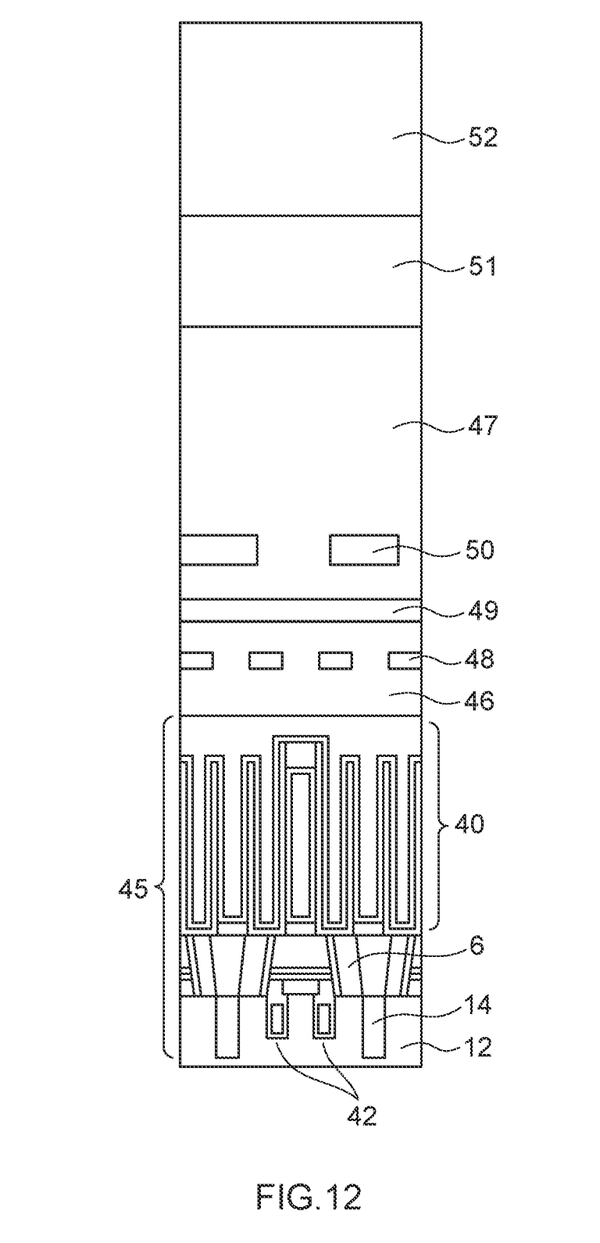
FIG. 12 is a longitudinal sectional view illustrating one example of a schematic configuration of the overall memory cell array region of the semiconductor memory device in the embodiment.

Next, with reference to FIG. 12, a schematic configuration of the overall memory cell region of the semiconductor memory device 1 in the embodiment will be described. FIG. 12 is a longitudinal sectional view illustrating one example of the configuration of the memory cell array region of the semiconductor memory device 1 in the embodiment. As illustrated in FIG. 12, above the semiconductor substrate 12 provided with the isolation regions 14, access transistors 42, and the like, capacitors 40 are provided. One end of the capacitor contact 6 is connected to the active region 10 and the other is connected to the capacitor 40. A lower electrode of the capacitor 40 is electrically connected, via the capacitor contact 6, to one of the source/drain regions of the access transistor 42 formed in the active region 10 of the semiconductor substrate 12. The memory cells 45 are provided on the semiconductor substrate 12 and include the isolation regions 14, the access transistors 42, the capacitor contacts 6, the capacitors 40, and the like.

Furthermore, above the capacitors 40, a plurality of layers of upper portion wirings (multilevel wirings layers) such as wirings 48, 49, 50, and 51 are provided. The numerals 46, 47, and 52 illustrated in FIG. 12 include insulating films. On the capacitor contact 6 illustrated in FIG. 4, the respective elements of the above-described numerals 40 to 52 are formed.

Figure 13:
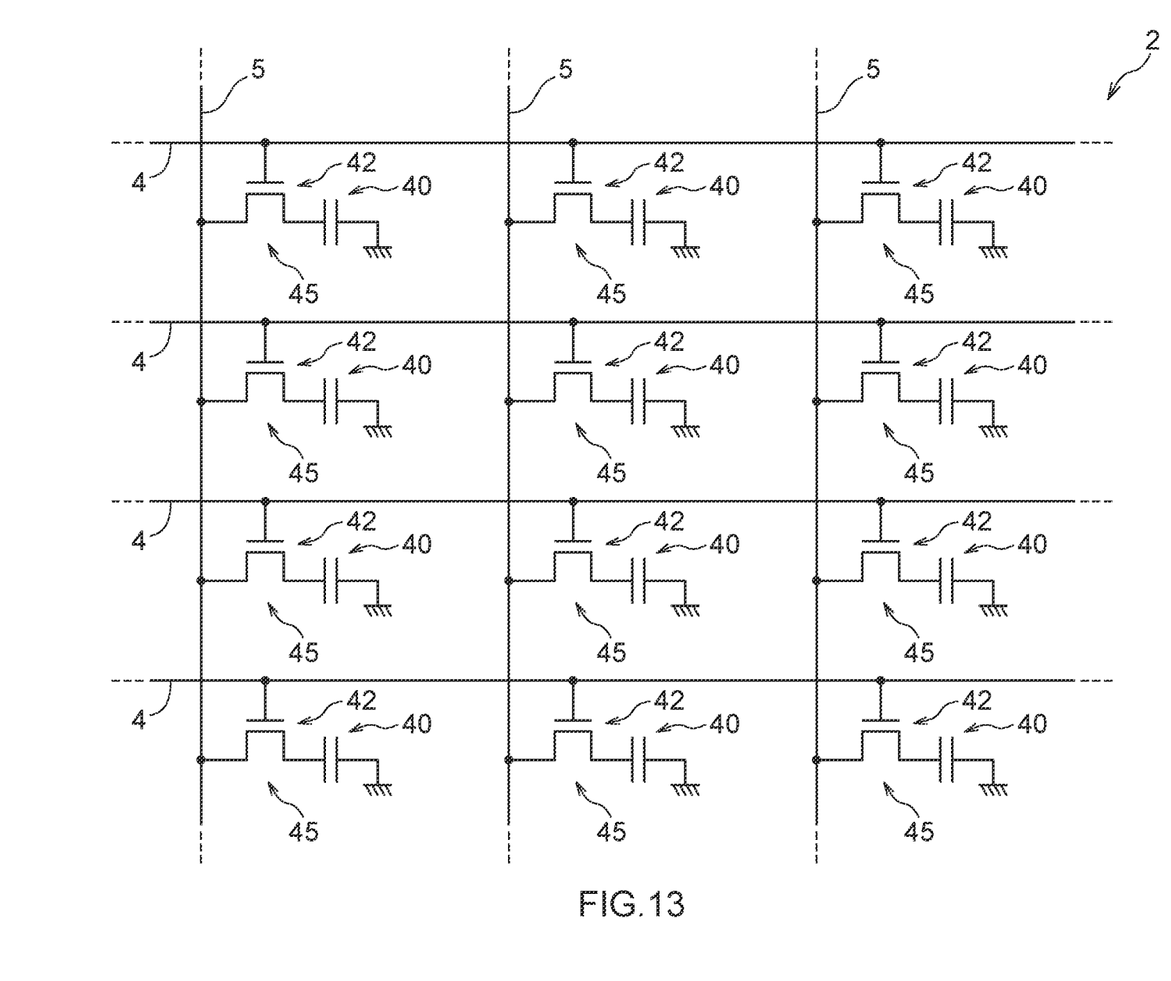
FIG. 13 is a circuit diagram illustrating a schematic configuration of an equivalent circuit of the memory cells of the semiconductor memory device in the embodiment.

FIG. 13 illustrates an equivalent circuit of the memory cell array of the semiconductor memory device 1 in the embodiment. Each of a plurality of memory cells 45 is connected to the intersection of a plurality of word lines 4 and bit lines 5 orthogonally arranged and is arranged in a matrix form. One memory cell 45 includes a pair of the access transistor 42 and the capacitor 40.

The access transistor 42 includes a MOSFET (metal-oxide-semiconductor field-effect transistor), for example. The gate electrode of the access transistor 42 functions as the word line 4 of the DRAM. The word line 4 functions as a control line controlling the selection of the memory cell corresponding thereto. One of the source/drain of the access transistor 42 is connected to the bit line 5 and the other is connected to the capacitor 40. The capacitor 40 includes a capacitor, and data is stored as electrical charges are accumulated in the capacitor.

When writing data to the memory cell 45, the potential to turn on the access transistor 42 is applied to the word line 4, and a low potential or a high potential corresponding to write data "0" or "1" is applied to the bit line 5. When reading out data from the memory cell 45, the potential to turn on the access transistor 42 is applied to the word line 4. The determination of data of the potential drawn out from the capacitor 40 to the bit line 5 is made by being sensed by a sense amplifier connected to the bit line 5.

Next, with reference to FIG. 4 to FIG. 11B, the method of forming the semiconductor memory device in the embodiment will be described.

Figure 5:
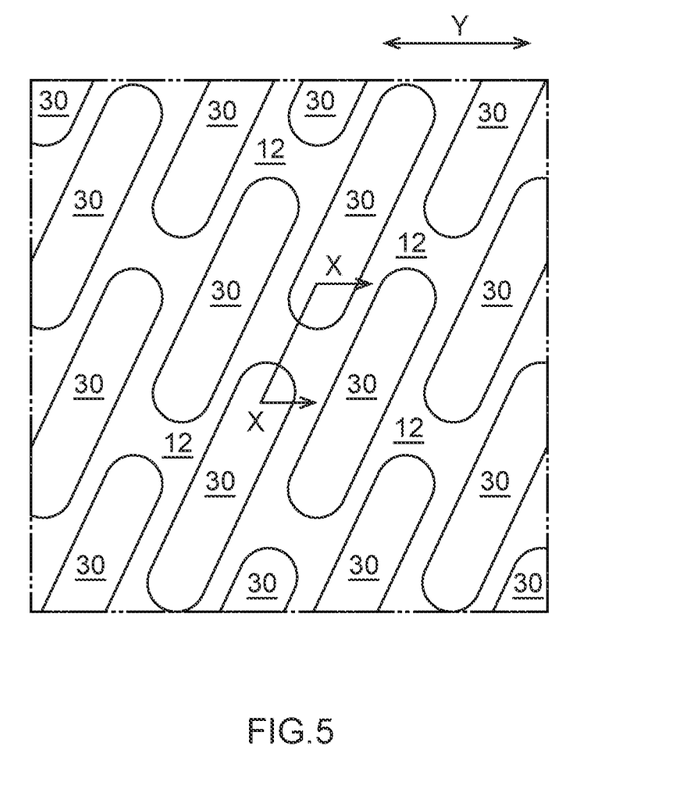
FIG. 5 is a diagram illustrating the method of forming the semiconductor memory device in the embodiment and is a plan view illustrating a schematic configuration of the layout of the memory cell array region in FIG. 6 to FIG. 8.
Figure 6:
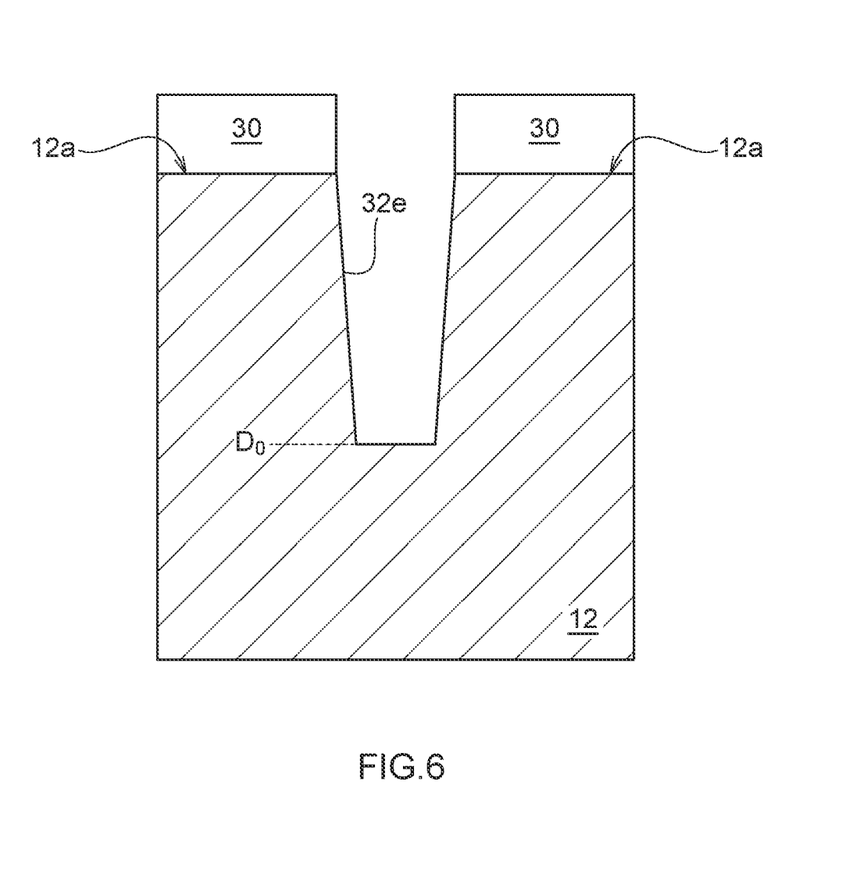
FIG. 6 is a diagram illustrating the method of forming the semiconductor memory device in the embodiment.

As illustrated in FIG. 5 and FIG. 6, a resist 30 is formed on the semiconductor substrate 12, and then the semiconductor substrate 12 is etched with the resist 30 as a mask. The resist 30 is equal to the pattern of the active regions 10 and the pattern of the resist 30 is transferred to the semiconductor substrate 12, thereby forming the isolation regions 14 and active regions 10.

In this etching, first dry etching, second dry etching, and third dry etching are performed. The first dry etching, the second dry etching, and the third dry etching are performed by the same etching equipment while switching the etching conditions. As the etching equipment used in this etching, various kinds of etching equipment, such as reactive ion etching (RIE) equipment, magnetron RIE equipment, electron-cyclotron resonance plasma etching equipment, and inductively coupled plasma etching equipment, can be selected. In addition, in this etching, as the reaction gas, halogen gas or halogen-containing gas is used, for example. Moreover, the reaction gas is used mixed with one or more gases selected from additive gases such as oxygen-containing gas, hydrogen bromide gas (HBr), sulfur hexafluoride gas ($SF_6$), and silicon tetrachloride gas ($SiCl_4$) and from inert gases such as argon (Ar) and Helium (He).

At first, the first dry etching is performed under anisotropic conditions. As RF (radio frequency) bias conditions, a bias power of about 400 to 600 watts is used, for example. By this etching, a trench 32e is formed from the top surface 12a of the semiconductor substrate 12 to the depth D0. The depth D0 can be controlled by adjusting the etching time.

Figure 7:
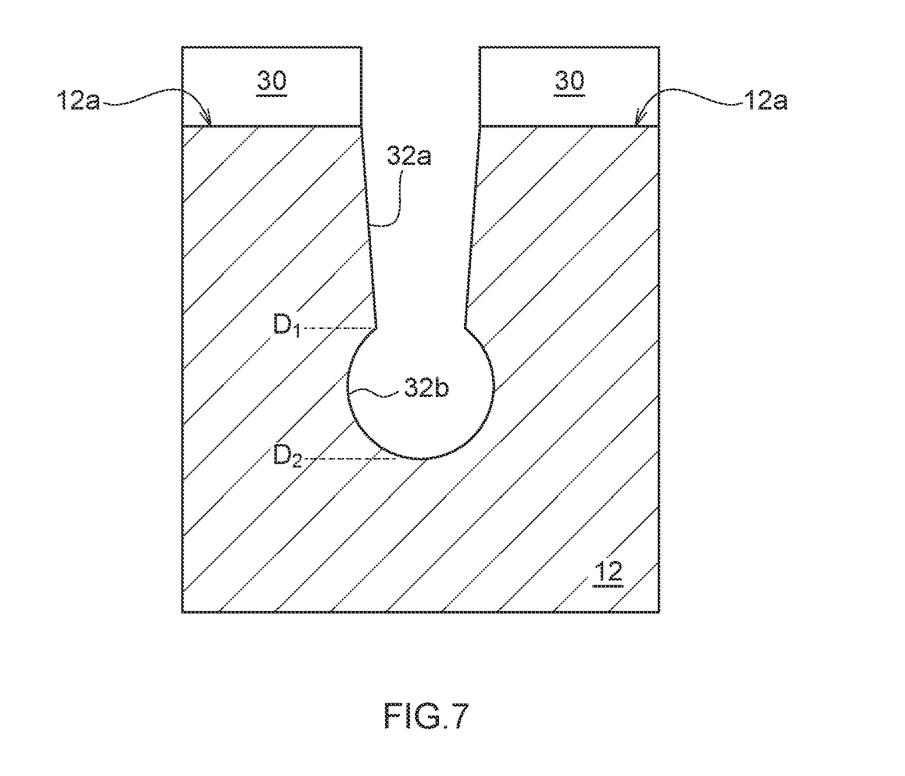
FIG. 7 is a diagram illustrating the method of forming the semiconductor memory device in the embodiment.

Subsequently, as illustrated in FIG. 7, the second dry etching is performed by switching etching conditions. In the second etching, the dry etching is performed under isotropic conditions. Specifically, as the RF (radio frequency) bias conditions, a bias power of zero watts or a bias power lower than the bias power of the first etching is used. By the second etching, the etching of the semiconductor substrate 12 progresses in an isotropic manner from the depth D0, and the shape of the trench expands in the vertical direction and the lateral direction, that is, in the active region 10 direction and becomes a shape having a curvature in a circle in the cross-section. In the cross-section illustrated in FIG. 7, the upper end of the circular middle trench 32b is the first depth D1 and the lower end is the second depth D2.

By the above-described etching, the upper trench 32a for which the shapes of the inner surfaces are linear in the cross-section and provided from the top surface 12a of the semiconductor substrate 12 to the first depth D1 is formed. In addition, the middle trench 32b provided from the first depth D1 to the second depth D2 is formed. The second depth D2 and the amount of bulge of the middle trench 32b in the lateral direction can be controlled by adjusting the etching time.

Figure 8:
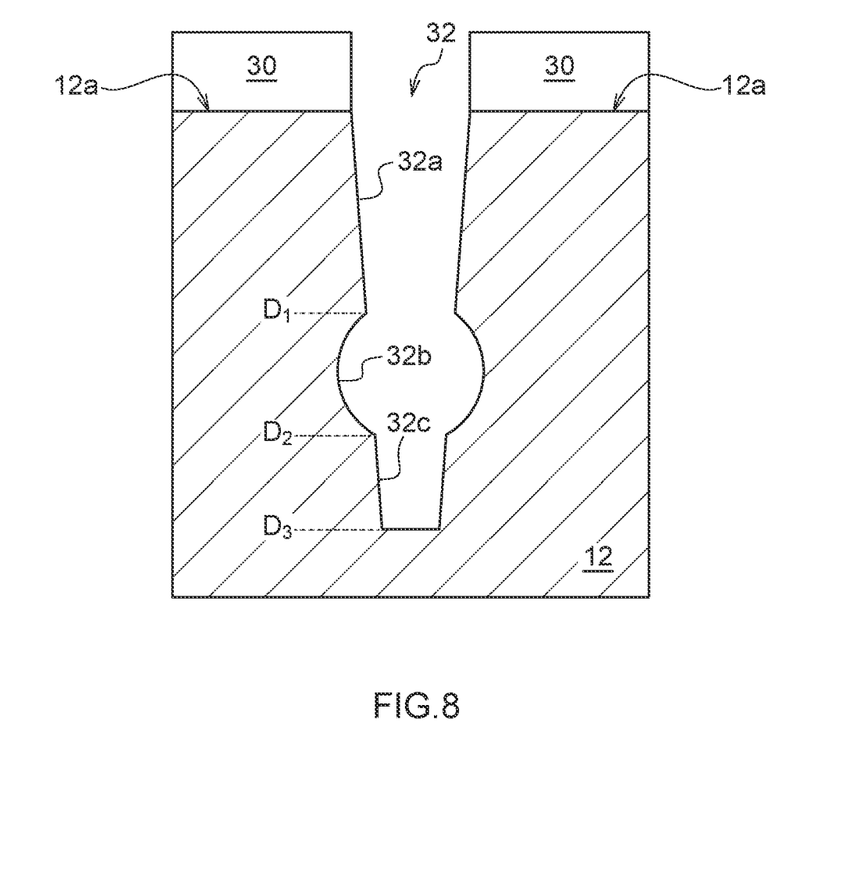
FIG. 8 is a diagram illustrating the method of forming the semiconductor memory device in the embodiment.

Then, as illustrated in FIG. 8, the third dry etching is performed by switching etching conditions. In this etching, the dry etching is performed under anisotropic conditions, down to the third depth D3. The etching conditions the same as those used for the first etching that etched the upper trench 32a are used. By the third etching, the lower trench 32c for which the shapes of the inner surfaces are linear in the cross-section and provided from the second depth D2 to the third depth D3 is formed. The third depth D3 can be controlled by adjusting the etching time. As in the foregoing, in the method of forming the semiconductor memory device 1 in the embodiment, in the middle of etching of the isolation trench 32, switching from anisotropic conditions to isotropic conditions is performed, and switching to anisotropic conditions is further performed.

Figure 9A:
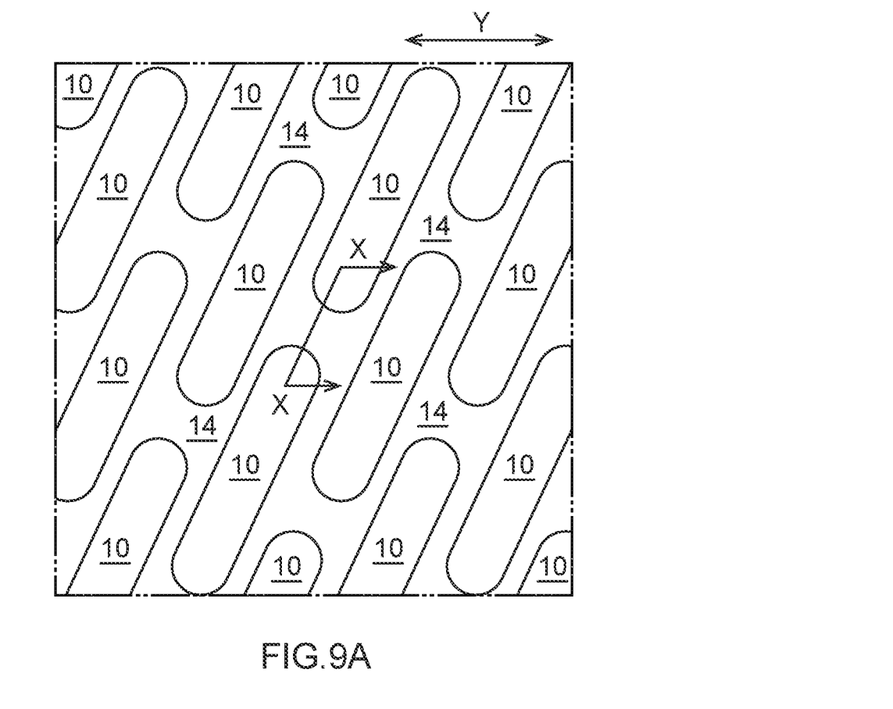
FIG. 9A and FIG. 9B are diagrams illustrating the method of forming the semiconductor memory device in the embodiment and are diagrams illustrating a schematic configuration of the memory cell array region at an exemplary process phase following FIG. 8.
Figure 9B:
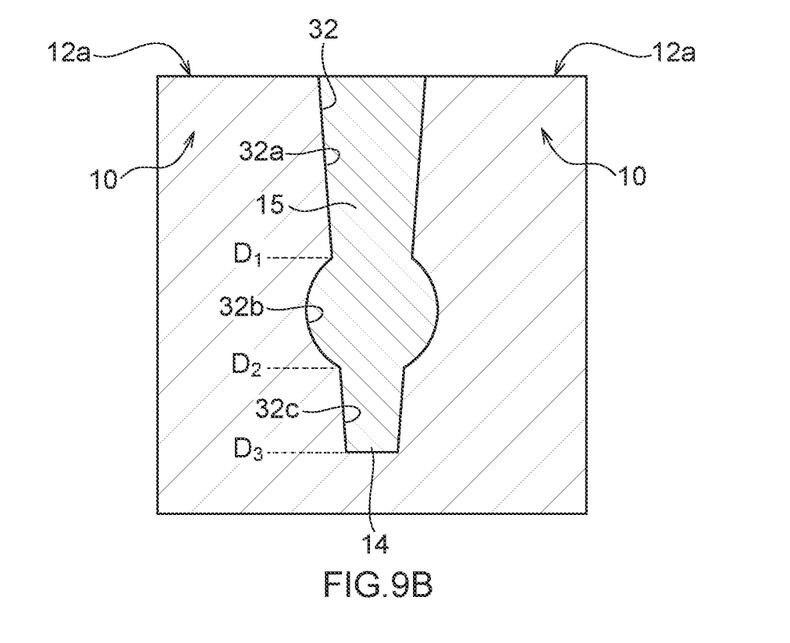

Then, as illustrated in FIG. 9A and FIG. 9B, the isolation insulating material 15 is formed so as to fill in the isolation trench 32 including the upper trench 32a, the middle trench 32b, and the lower trench 32c. The isolation insulating material 15 includes an insulating material, such as silicon dioxide. The isolation insulating material 15 is formed in the following manner. The silicon dioxide is formed by chemical vapor deposition (hereinafter referred to as "CVD"), for example. The silicon dioxide is deposited to form a film so as to fill in the isolation trench 32 and cover the top surface 12a of the semiconductor substrate 12. Then, etching-back is performed by anisotropic dry etching to an extent that the silicon dioxide on the top surface 12a is removed. As a result, the silicon dioxide in the remaining portion act as the isolation insulating material 15. The upper surface of the isolation insulating material 15 is formed so as to be a level substantially equal to that of the top surface 12a of the semiconductor substrate 12.

By this process, as illustrated in FIG. 9B, the isolation region 14 in which the isolation trench 32 is filled with the isolation insulating material 15 is formed.

Figure 10A:
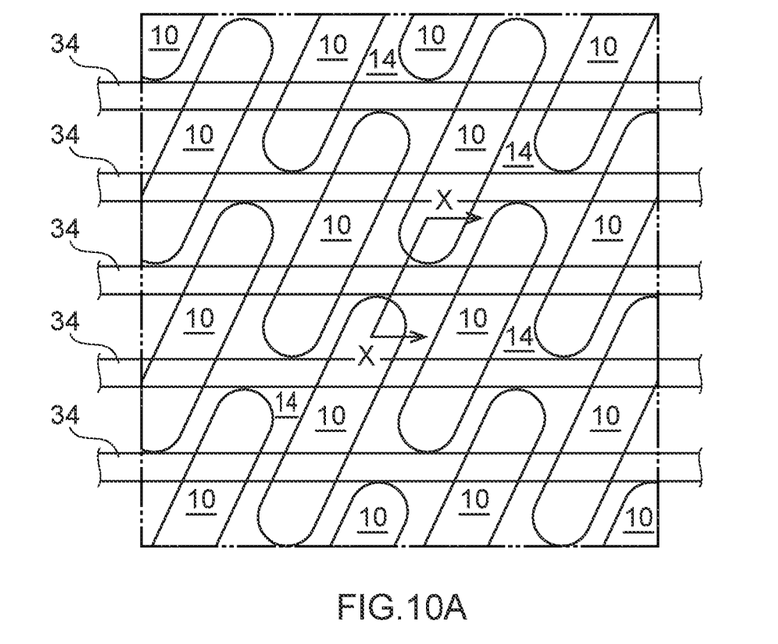
FIG. 10A and FIG. 10B are diagrams illustrating the method of forming the semiconductor memory device in the embodiment and are diagrams illustrating a schematic configuration of the memory cell array region at an exemplary process phase following FIG. 9A and FIG. 9B.
Figure 10B:
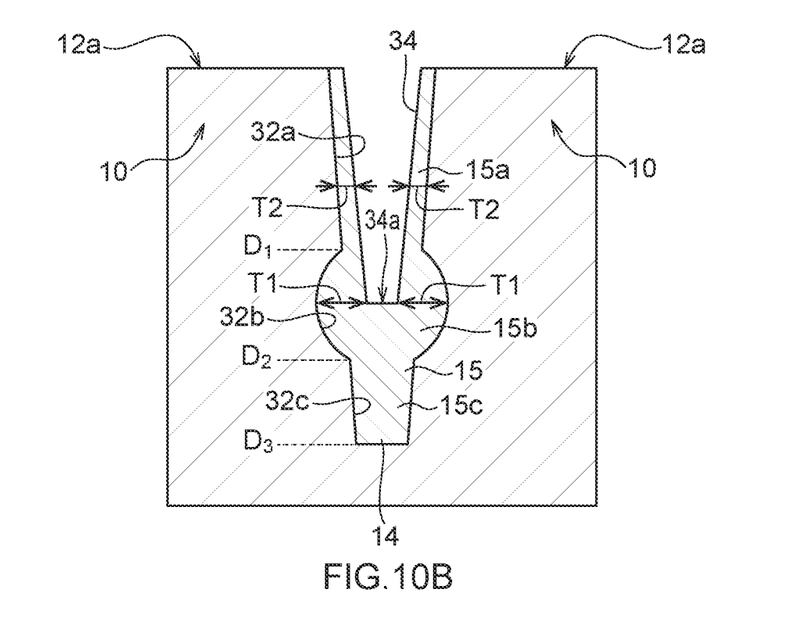

Next, as illustrated in FIG. 10A and FIG. 10B, the word-line trench 34 is formed so as to extend linearly in the word line direction Y and pass across a plurality of active regions 10 and the isolation region 14 between the active regions 10. A plurality of word-line trenches 34 are arranged in the direction orthogonal to the word line direction Y at an equal repetition pitch.

The word-line trench 34 is formed by using a lithography technique and an anisotropic dry etching technique, for example. The word-line trench 34 can be formed by using a double patterning technique or a quad patterning technique, for example. This anisotropic dry etching is performed under the conditions in which the etching rates of silicon constituting the active region 10 and silicon dioxide constituting the isolation region 14 are substantially equal. The lower end 34a of the word-line trench 34 is adjusted to be the middle of the first depth D1 and the second depth D2.

The isolation insulating material 15 includes the upper insulating films 15a provided on the sidewalls of the upper trench 32a, the middle insulating film 15b provided in the middle trench 32b, and the lower insulating film 15c provided in the lower trench 32c. The location of the lower end 34a of the word-line trench 34 is arranged within the range of depth in which the middle trench 32b is formed. The film thickness T1 of the isolation insulating material 15 between the lower end 34a of the word-line trench 34 and each of the inner surfaces of the middle trench 32b is thicker than the film thickness T2 of the isolation insulating material 15 in the upper trench 32a. The film thickness T1 is controlled by the amount of etching in the lateral direction of the middle trench 32b by the second etching described with reference to FIG. 7, that is, the amount of lateral spreading.

Figure 11A:
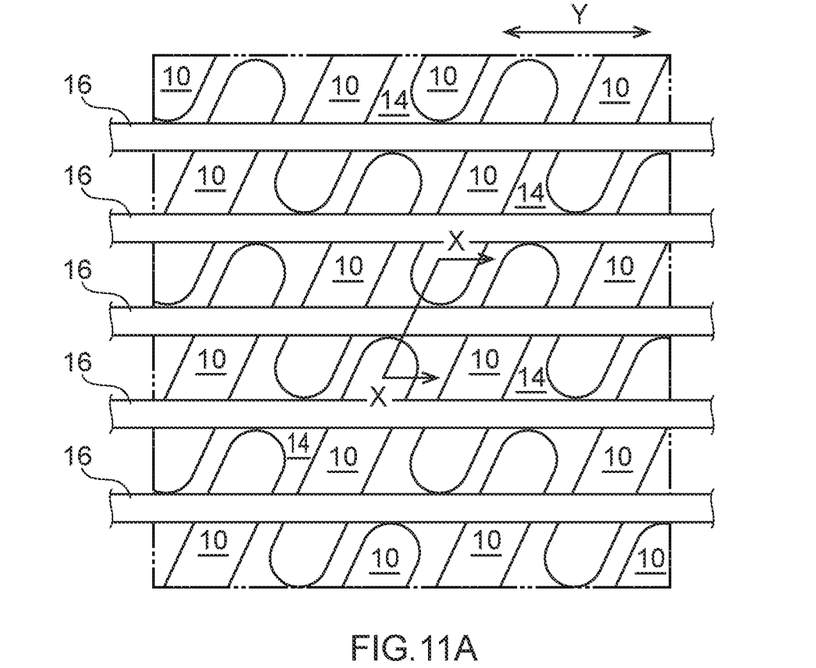
FIG. 11A and FIG. 11B are diagrams illustrating the method of forming the semiconductor memory device in the embodiment and are diagrams illustrating a schematic configuration of the memory cell array region at an exemplary process phase following FIG. 10A and FIG. 10B.
Figure 11B:
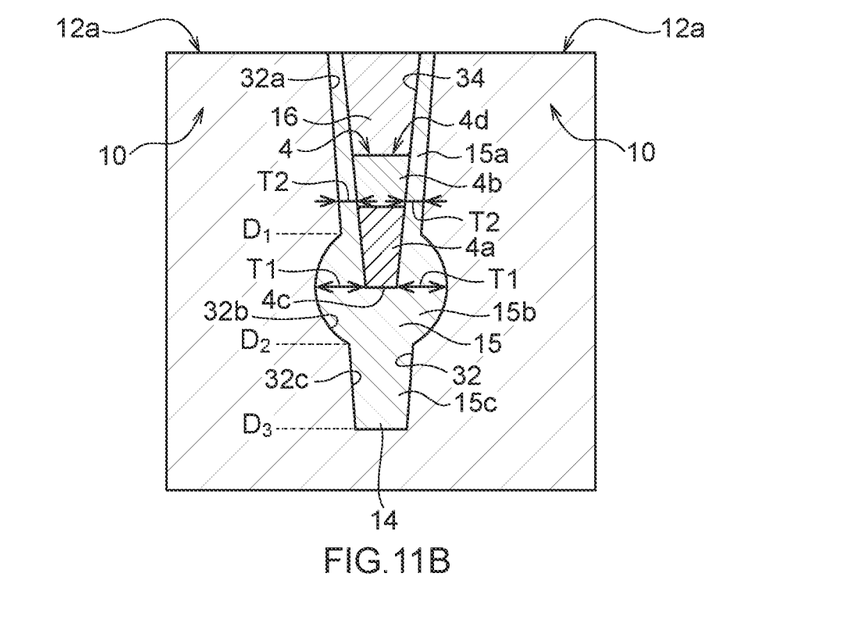

Next, as illustrated in FIG. 11A and FIG. 11B, the word line 4 is formed in the word-line trench 34, and the cap insulating material 16 is formed on the upper portion of the word line 4. The word line 4 includes the lower conductive portion 4a and the upper conductive portion 4b. The lower conductive portion 4a is arranged in the lower portion of the isolation trench 32. The upper conductive portion 4b is arranged on the lower conductive portion 4a. The cap insulating material 16 is arranged on the upper conductive portion 4b.

The lower conductive portion 4a includes a conductive material, such as titanium nitride. The lower conductive portion 4a is formed in the following manner. For example, by using CVD, titanium nitride is formed so as to fill in the isolation trench 32 and cover the top surface 12a of the semiconductor substrate 12. Then, etching-back is performed by performing anisotropic dry etching, and the titanium nitride is removed until getting to a predetermined height. As a result, the remains in the lower portion of the isolation trench 32 act as the lower conductive portion 4a. The location of the upper surface of the lower conductive portion 4a is controlled by adjusting the etching-back time.

The upper conductive portion 4b includes a conductive material, such as polysilicon in which impurities such as phosphorus, arsenic, or boron are doped, for example. The upper conductive portion 4b is formed in the following manner. For example, by using CVD, polysilicon is formed so as to fill in the isolation trench 32 on the lower conductive portion 4a and cover the top surface 12a of the semiconductor substrate 12. Then, etching-back is performed by performing anisotropic dry etching, and polysilicon is removed until getting to a predetermined height. This empties the space in the upper portion of the isolation trench 32. As a result, the remains in the middle of the isolation trench 32 and on the lower conductive portion 4a act as the upper conductive portion 4b. The location of the upper surface of the upper conductive portion 4b is controlled by adjusting the etching-back time.

Next, in the space on the upper conductive portion 4b, the cap insulating material 16 is filled. The cap insulating material 16 includes an insulating material, such as silicon nitride. The cap insulating material 16 is formed in the following manner. First, for example, by using CVD, silicon nitride is deposited to form a film so as to fill in the word-line trench 34 and further cover the top surface 12a of the semiconductor substrate 12. Then, etching-back is performed by performing anisotropic dry etching to an extent that the insulating film on the top surface 12a is removed, and then the remaining portion acts as the cap insulating material 16. The upper surface of the cap insulating material 16 is formed so as to be a level substantially equal to that of the top surface 12a of the semiconductor substrate 12.

Next, as illustrated in FIG. 4, on the semiconductor substrate 12 in which the word line 4 (pWL 4d) and the cap insulating material 16 are formed in the word-line trench 34, an insulating film 18 is formed, and then, the capacitor contacts 6 that run through the insulating film 18 and connect to the active regions 10 are formed. The insulating film 18 includes an insulating material, such as silicon dioxide. The insulating film 18 is formed by CVD, for example. The capacitor contact 6 includes a conductive material, such as titanium nitride. Thereafter, the capacitors 40, wirings 48, 49, 50, and 51, and insulating films 46, 47, and 52 illustrated in FIG. 12 are formed. By the above-described processes, the semiconductor memory device 1 in the embodiment is formed.

In the semiconductor memory device 1 in the embodiment, as illustrated in FIG. 4, the isolation trench 32 formed in the semiconductor substrate 12 includes the upper trench 32a, the middle trench 32b arranged under the upper trench 32a, and the lower trench 32c arranged under the middle trench 32b.

The inner surfaces of the middle trench 32b are bulged having a curvature so as to project toward the outside, that is, project to the active regions 10. The location of the bottom 4c of the word line 4 or the pWL 4d is within the range of height of the middle trench 32b and the bottom 4c is located in the middle of the middle trench 32b. The film thickness T1 of the isolation insulating material 15 of the isolation region 14 in the lateral direction of the bottom 4c of the word line 4 or the pWL 4d is larger than the film thickness T2 of the isolation insulating material 15 in the lateral direction of the upper conductive portion 4b. The film thickness T1 is a film thickness between the bottom 4c of the pWL 4d and each of the inner surfaces of the middle trench 32b. The film thickness T2 is a film thickness of the isolation insulating material 15 between the upper conductive portion 4b and each of the inner surfaces of the upper trench 32a in the lateral direction thereof.

Now, GIDL, refresh characteristics, and row hammer characteristics will be described. As for the refresh characteristics, when the GIDL increases, as a cell high is likely to fail, the refresh interval time may no longer be possible to set long. In addition, in the case where the word line is repeatedly turned on and off consecutively (that is, hammer) and when the access transistor is on, a channel may be formed on the active silicon of the side surface of the word line and the movement of electrons from the capacitor to the channel may be caused.

When the access transistor is off, while the majority of electrons return to the capacitor side before the channel portion disappears, there may be some electrons lost due to recombination with holes in the channel, trap to defects, and the like. As a result, during a plurality of times of hammer, the fluctuation in the potential of capacitor may occur, and the high/low of the cell may no longer be possible to sense correctly. In the bottom 4c of the pWL 4d of the isolation region 14, the electric field with the source/drain region of the adjacent active region 10 not depicted may be increased, so that the current due to the trap level may increase and the refresh characteristics and the row hammer characteristics may fluctuate.

In the semiconductor memory device 1 in the embodiment, at the depth position of the bottom 4c of the word line 4 in the isolation region 14, that is, the pWL 4d, the inner surfaces of the isolation region 14 are bulged to the active regions 10 and have a semi-circular shape in the cross-section. As a result, at the middle portion of the middle trench 32b where the bottom 4c of the pWL 4d is located, the film thickness T1 of the isolation insulating material 15 is thick and is at least thicker than the film thickness T2 of the upper trench 32a. Consequently, as the electric field between the pWL 4d and the active region 10 adjacent thereto is alleviated, the refresh characteristics and the row hammer characteristics are improved. As a result, because the data retention characteristics of DRAM can be further improved while promoting miniaturization, the DRAM of higher performance can be achieved.

As in the foregoing, the semiconductor memory device 1 in the embodiment has been described with the DRAM as an example, but this is a mere example. Unless otherwise departing from the gist of the embodiment, the semiconductor memory device can be applied to memory devices other than DRAM, for example, such memory devices as an SRAM (static random-access memory), flash memory, EPROM (erasable programmable read-only memory), MRAM (magnetoresistive random-access memory), and phase-change memory.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus comprising:
a semiconductor substrate;
an isolation region in the semiconductor substrate, the isolation region including an isolation trench filled with an insulating material therein;
a plurality of island-shaped active regions in the semiconductor substrate surrounded by the isolation region; and
a buried word-line having a bottom, the buried word-line at least passing across the isolation region between the plurality of active regions;
wherein the isolation trench includes upper, middle and lower portions, each of the upper and lower portions has a substantially flat surface and the middle portion has a bulged surface.

2. The apparatus of claim 1, wherein the bottom of the buried word-line is located within the range of the middle portion of the isolation trench.

3. The apparatus of claim 1, wherein a film thickness of the insulating material between the bottom of the buried word-line and an inner surface of the middle portion is larger than another film thickness of the insulating material between the buried word-line and an inner surface of the upper portion.

4. The apparatus of claim 1, wherein the insulating material includes silicon dioxide.

5. The apparatus of claim 1, wherein the buried word-line includes a first conductive portion in a lower portion thereof, a second conductive portion on the lower portion thereof.

6. The apparatus of claim 5, wherein the first conductive portion includes titanium nitride, the second conductive portion includes silicon.

7. The apparatus of claim 1, further comprising:
a capacitor contact on the active region adjacent to the buried word-line passing over the isolation region between the active regions,
a capacitor on the capacitor contact.

8. The apparatus of claim 1, wherein the buried word-line is in a word-line trench extending across the active regions and the isolation region.

* * * * *